(12) United States Patent
Suzuki et al.

(10) Patent No.: US 6,483,356 B2
(45) Date of Patent: Nov. 19, 2002

(54) SINUSOIDAL SIGNAL GENERATING CIRCUIT PROVIDING SMALL PHASE DIFFERENCE WITH RESPECT TO REFERENCE SIGNAL AND APPARATUS FOR DRIVING OSCILLATING ELEMENT WITH CIRCUIT

(75) Inventors: Hirohisa Suzuki, Osaka (JP); Masaaki Nishimura, Osaka (JP); Kazuo Hasegawa, Miyagi-ken (JP); Daisuke Takai, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/966,573

(22) Filed: Sep. 26, 2001

(65) Prior Publication Data
US 2002/0118051 A1 Aug. 29, 2002

(30) Foreign Application Priority Data
Sep. 27, 2000 (JP) .......................... 2000-293252

(51) Int. Cl.[7] .............................................. H03B 28/00
(52) U.S. Cl. ...................................... 327/129; 327/309
(58) Field of Search ................ 327/129, 180, 327/182, 309, 321; 331/131, 147, 152, 184

(56) References Cited

U.S. PATENT DOCUMENTS 5,565,817 A * 10/1996 Lakshmikumar ............ 327/237
5,612,609 A * 3/1997 Choi .......................... 323/210
5,936,479 A * 8/1999 Morgan et al. ............. 331/111
6,229,372 B1 * 5/2001 Mashak et al. ............. 327/309

FOREIGN PATENT DOCUMENTS

JP          P3095443          8/2000

* cited by examiner

*Primary Examiner*—My-Trang Nu Ton
(74) *Attorney, Agent, or Firm*—Beyer Weaver & Thomas

(57) ABSTRACT

A sinusoidal signal generating circuit for ensuring a small phase difference with respect to a reference signal is provided. The sinusoidal signal generating circuit comprises a capacitor for charging/discharging, a charging unit for charging a predetermined current to the capacitor, and a discharging unit for discharging a current therefrom, whereby an output signal is produced by the change in the potential of the capacitor, wherein the charging unit comprises a charging current adjusting unit for adjusting the magnitude of the charging current, and the discharging unit comprises a discharging current adjusting unit for adjusting the magnitude of the discharging current, and a control signal generating means is provided for supplying a plurality of control signals to the charging current adjusting unit and the discharging current adjusting unit in such a manner that the potential of the capacitor is changed into a sinusoidal waveform. The sinusoidal signal generating circuit can be employed as a dividing means and a driving means in an apparatus for driving a vibrating element.

14 Claims, 6 Drawing Sheets

SINUSOIDAL SIGNAL GENERATING CIRCUIT PROVIDING SMALL PHASE DIFFERENCE WITH RESPECT TO REFERENCE SIGNAL AND APPARATUS FOR DRIVING OSCILLATING ELEMENT WITH CIRCUIT

BACKGROUND OF THE INVENTION

1. Field of the Invention

The present invention relates to a sinusoidal signal generating circuit which is used to generate a driving signal for an oscillating element in an angular velocity sensor or the like, and more specifically, to a sinusoidal signal generating circuit which provides a small phase difference with respect to a reference signal and which ensures the minimum generation of noise consisting of high frequency signal components. The present invention also relates to an apparatus for driving an oscillating element with the circuit.

2. Description of the Related Art

FIG. 5A shows an arrangement of a conventional sinusoidal signal generating circuit, and FIG. 5B is a diagram showing the phase delay in the conventional circuit. FIG. 6 conceptually shows an aspect of generating a sinusoidal signal in another conventional sinusoidal signal generating circuit, where V1, V2 and V3 are corresponding input signals and Vo is a sinusoidal output signal.

The sinusoidal signal generating circuit shown in FIG. 5A is constituted by a so called voltage-source-type low pass filter, in which resistors Ra, Rb and capacitors Ca, Cb are associated with an operational amplifier means A1. In the sinusoidal signal generating circuit, a reference signal Vs having a rectangular waveform is supplied to a noninverting input terminal of the operational amplifier A1, and then a sinusoidal output is generated at the output terminal thereof.

On the other hand, three kinds of rectangular signals are used as shown in FIG. 6; an original or source rectangular signal V1, a first reference signal V2 determined by reducing the width of a positive pulse inwards by a predetermined value of time at both the rising edge and falling edge of the source signal, and a second reference signal V3 determined similarly by reducing the width of a negative pulse, and a stepwise output signal Vo exhibiting a pseudo sinusoidal waveform is generated by adding these rectangular signals in a conventional adder (not shown).

However, in the sinusoidal signal generating circuit shown in FIG. 5, the reference signal Vs passes through a low pass filter consisting of a resistor and a capacitor, so that the resistance of the resistor and the capacitance of the capacitor change when the temperature around the circuit varies. As a result, the shape of the output signal Vo is deformed and the output signal Vo after the temperature variation has a phase delay with respect to the output signal Vo at the ordinary temperature, as shown in FIG. 5B. In particular, a phase difference sensing type angular velocity sensor has a limited tolerance regarding the phase difference between the reference signal and the output signal, and therefore the sensor cannot be used as such a sinusoidal signal generating circuit.

Moreover, in the circuit arrangement shown in FIG. 6, the sinusoidal output signal is generated as a pseudo sinusoidal signal consisting of stepwise signals by adding a plurality of rectangular signals. Hence, there always exist rising edges and falling edges in a waveform of the output signal, and the number of these edges increases with the increase of the resolving power. Noise N containing spike-like high frequency signal components often occurs at each edge, and an undesirable effect due to the noise signal extends to the other parts of the circuit arrangement.

If, moreover, the output signal generated by the circuit arrangement in FIG. 6 passes through a low pass filter, the above-mentioned high frequency signal components can be rejected. Nevertheless, the problem regarding the phase difference due to the temperature variation still remains unchanged.

SUMMARY OF THE INVENTION

The present invention aims to solve the above-mentioned problems in the prior art, and it is an object of the present invention to provide a sinusoidal signal generating circuit, which ensures minimal phase delay with respect to a reference signal.

Moreover, it is another object of the invention to provide a sinusoidal signal generating circuit, which ensures the minimum generation of noise containing the high frequency signal components.

Furthermore, it is another object of the present invention to provide an apparatus for driving a vibrating element with the above-mentioned circuit for generating a sinusoidal signal.

To attain the above objects, the present invention offers a sinusoidal signal generating circuit comprising a capacitor for charging and discharging, a charging unit for supplying a predetermined charging current to the capacitor and a discharging unit for discharging the discharging current from the capacitor, whereby an output signal is generated by altering the potential of the capacitor, wherein the charging unit includes a charging current adjusting unit for adjusting the magnitude of the discharging current, wherein the discharging unit includes a discharging current adjusting unit for adjusting the magnitude of the discharging current, and wherein a control signal generating means for supplying a plurality of control signals to both the charging current adjusting unit and the discharging current adjusting unit is disposed.

In accordance with the present invention, the charging/discharging of a capacitor is carried out by combining two different discharging currents with two different charging currents, thereby making it possible to vary the potential of the capacitor in various slopes and to produce a pseudo sinusoidal signal by combining the various slopes of the potential.

In the above circuit arrangement, the control signal generating means preferably consists of at least more than one divider for dividing the frequency of the reference signal, a pause duration determining circuit for suppressing the output signal of the dividers for a determined duration in such a manner that control signals do not change, a logic circuit for generating the control signals in a predetermined timing from the signals supplied from the dividers and the pause duration determining circuit.

In the circuit arrangement, it is possible to preset the timing for switching over the charging currents and the discharging currents in such a manner that the signal output approaches a sinusoidal signal.

Moreover, even if the resistance and capacitance are altered, due to, for instance, a temperature variation, no change in the timing for switching over the charging currents and discharging currents arises, thereby making it possible to generate a highly accurate sinusoidal signal without any phase delay.

Moreover, the charging current adjusting unit and the discharging current adjusting unit are each constituted by a plurality of resistors for adjusting the magnitude of currents in a constant current circuit, and a switching means for switching the connections of the resistors, whereby the switching means is preferably controlled by the control signal generating means.

In this case, the slope in the potential variation of the capacitor is determined by a time constant, which is given by a product of the magnitudes of both the resistance of the resistor and the capacitance of the capacitor.

In the above circuit arrangement, the slope of a sinusoidal signal can be preset by changing the time constant of the circuit in which the charging current and discharging current flow.

Furthermore, the charging unit and the discharging unit are each constituted by a current mirror circuit.

In the above circuit arrangement, the charging current to the capacitor and the discharging current therefrom can each be set with a constant current, thereby making it possible to vary the potential of the capacitor in a predetermined slope.

In the above circuit arrangements, moreover, it is preferable to dispose a clamp circuit for clamping an extreme positive or negative value of at least a sinusoidal output to a predetermined voltage value.

Since the extreme positive or negative value of the sinusoidal signal can be set as a fixed value in the above circuit arrangement, the sinusoidal signal can be confined within a fixed amplitude. As a result, the sinusoidal signal can be treated within a predetermined dynamic range, and the center of the amplitude of the sinusoidal signal is preset to a predetermined value.

Moreover, it is preferable to dispose a temperature correcting means for adjusting the magnitudes of both the charging current and discharging current in accordance with the temperature variation.

In the circuit arrangement, it is possible to fix the magnitudes of both the charging current and discharging current into corresponding predetermined values, thereby being able to always obtain a sinusoidal signal having a predetermined amplitude.

In accordance with the present invention, furthermore, an apparatus for driving a vibrating element includes the vibrating element for supplying two output signals at a given angular velocity, said phases of output signals being different from each other, a digitizing means for converting the two output signals into corresponding binary signals in accordance with the polarity of amplitude in the output signals, a phase difference sensing unit for supplying a pulse signal corresponding to a differential signal by determining the phase difference between the two output signals, a low pass filter for generating a control signal from the pulse signal, a voltage controlled oscillator for providing an oscillation having a frequency in accordance with the control signal, a divider means for generating a divided signal having a predetermined frequency by dividing the reference signal supplied from the voltage control oscillator, and a driving means for generating a driving signal for the vibrating element from the divided signal. In the apparatus for driving the vibrating element, it is possible to use the above-mentioned sinusoidal signal generating circuits as the divider means and the driving means.

DESCRIPTION OF THE PREFERRED EMBODIMENTS

Figure 1:
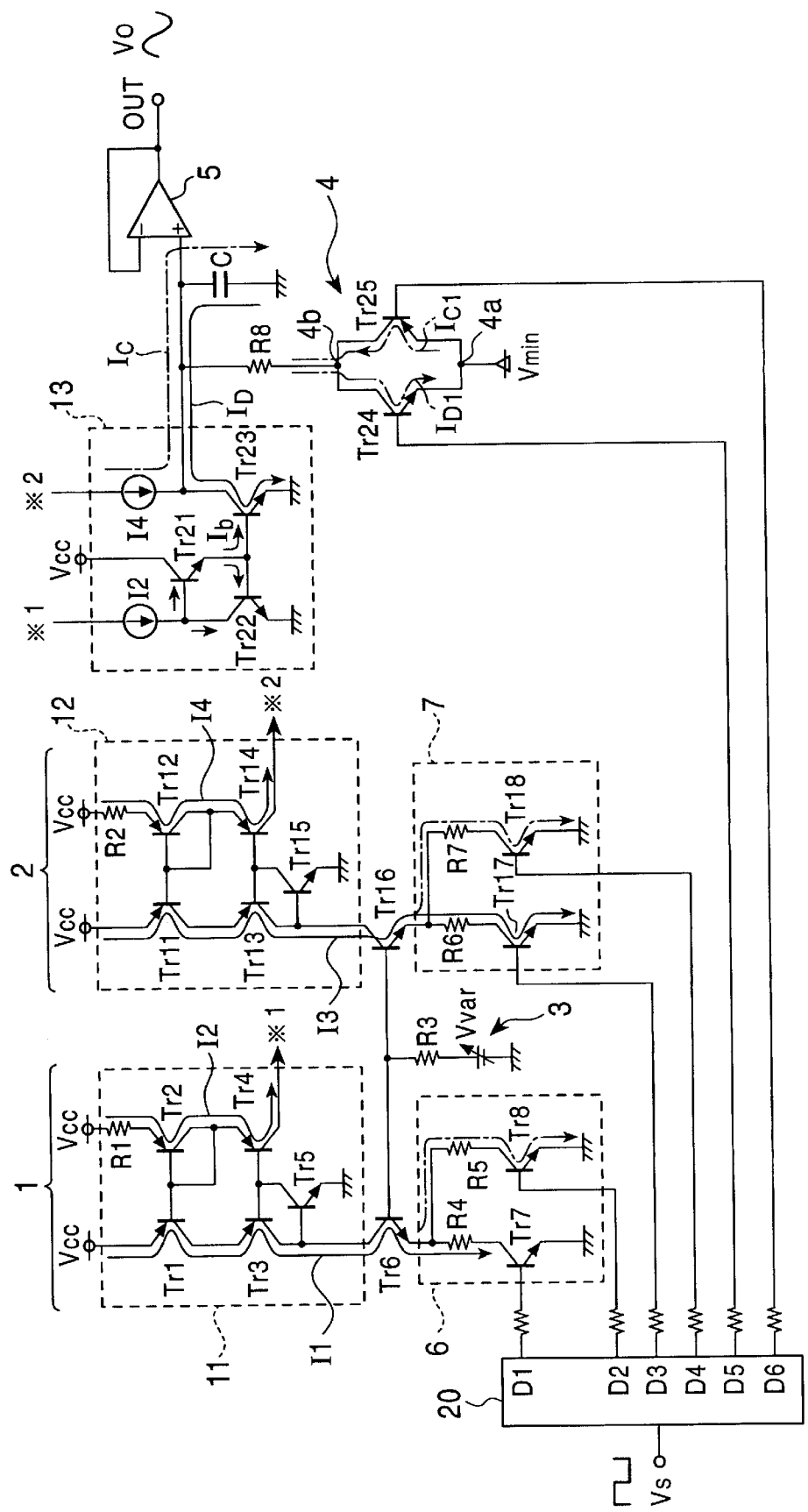
FIG. 1 is a circuit diagram of a sinusoidal signal generating circuit according to the invention.

In the following, referring to the drawings, the present invention will be described in detail.

FIG. 1 is a circuit arrangement showing a sinusoidal signal generating circuit according to the invention.

The sinusoidal signal generating circuit shown in FIG. 1 is constituted by a discharging unit 1, a charging unit 2, a temperature correcting means 3, a capacitor for charging and discharging, a clamping means 4, a buffering means 5 and a control signal generating means 20.

In the embodiment shown in FIG. 1, the discharging unit 1 is constituted by both a current mirror circuit 11 including transistors Tr1, Tr2, Tr3, Tr4 and Tr5, and a discharging current adjusting unit 6 including transistors Tr7 and Tr8. The respective base terminals of the transistors Tr7 and Tr8 are connected to the control signal generating means 20, and control signals D1 and D2 are respectively supplied to the base terminals. Resistors R4 and R5 are connected to the respective collector terminals of the transistors Tr7 and Tr8, and the respective emitter terminals thereof are grounded. The other terminals of the resistor R4 and resistor RS are connected to the emitter terminal of a transistor Tr6.

The charging unit 2 has substantially the same structure as the discharging unit 1. That is, the charging unit 2 is constituted by both a current mirror circuit 12 including transistors Tr11, Tr12, Tr13, Tr14 and Tr15, and a charging current adjusting unit 7 including transistors Tr17 and Tr18. Control signals D3 and D4 generated in the control signal generating means 20, which will be later described, are supplied to the respective base terminals of said transistors Tr17 and Tr18. Resistors R6 and R7 are connected to the respective collector terminals of the transistors Tr17 and Tr18, and the respective emitter terminals thereof are grounded. The other terminals of the resistor R6 and resistor R7 are connected to the emitter terminal of a transistor Tr16.

As shown by the symbol *1 in FIG. 1, the collector terminal of the transistor Tr4 is connected to both the base terminal of the transistor Tr21 and the collector terminal of the transistor Tr22, and the emitter terminal of said transistor Tr22 is grounded. Similarly, as shown by the symbol *2, the collector terminal of the transistor Tr14 is connected to the collector terminal of the transistor Tr23, and the emitter terminal of the transistor Tr23 is grounded. In this case, the transistors Tr22 and Tr23 are connected to each other via their base terminals, and the emitter terminal of the transistor Tr21 is further connected to the thus connected portion of the transistors Tr22 and Tr23. Moreover, the collector terminal of the transistor Tr22 is connected to the base terminal of the transistor Tr21, the collector terminal of which is connected to a supply voltage Vcc. In other words, the transistors Tr21, Tr22 and Tr23 form a current mirror circuit 13, and when a collector current flows in the transistor Tr22, the same magnitude of the collector current also flows in the transistor Tr23.

Furthermore, the capacitor C, the clamping means 4 and the buffering means 5 are connected to the collector terminal of the transistor Tr23. The clamping means 4 is constituted by transistors Tr24 and Tr25. The transistors Tr24 and Tr25 comprise an NPN type transistor and a PNP type transistor, respectively. The collector terminals and the emitter terminals of both the transistors Tr24 and Tr25 are connected to each other, in which case, a lower limit supply voltage Vmin is connected to one connecting point 4a, and the other connecting point 4b is connected to the collector terminal of the transistor Tr23 via a resistor R8. Moreover, the control signal generating circuit 20, which will be later described, is connected to the respective base terminals of the transistors Tr24 and Tr25, and control signals D5 and D6 are respectively supplied to the base terminals thereof.

The buffering means 5 should be a component having a high input impedance and a low output impedance, and generally the buffering means 5 can be constituted by a voltage flower in which an operational amplifier is used. A sinusoidal output signal Vo is supplied from the output terminal OUT of the buffering means 5. The lower limit supply voltage Vmin is a supply voltage on the side of the lower limit in the sinusoidal output signal, which corresponds to the output from the sinusoidal signal generating circuit.

The temperature correcting means 3 is constituted in such a way that the base terminals of the transistors Tr6 and Tr16 are connected to each other, and a variable supply voltage Vvar is connected to the above connection portion via resistor R3. The variable supply voltage Vvar is an output for a temperature sensor or the like, the voltage of which changes in proportion to the temperature variation, and for the sake of this purpose, for instance, the voltage between the base and emitter of a transistor can be used as a simplified temperature sensor. By utilizing the variable supply voltage Vvar, it is possible to control the base currents of both the transistor Tr6 and the transistor Tr16 in response to the temperature variation. As a result, both a stationary current I1 which flows through the transistors Tr1, Tr3, Tr6, resistor R4 and transistor Tr7 on the discharging unit 1 side and a constant current I3 which flows through the transistors Tr11, Tr13, Tr16, resistor R6 and transistor Tr17 on the charging unit 2 side can be controlled in accordance with the temperature variation.

Figure 2:
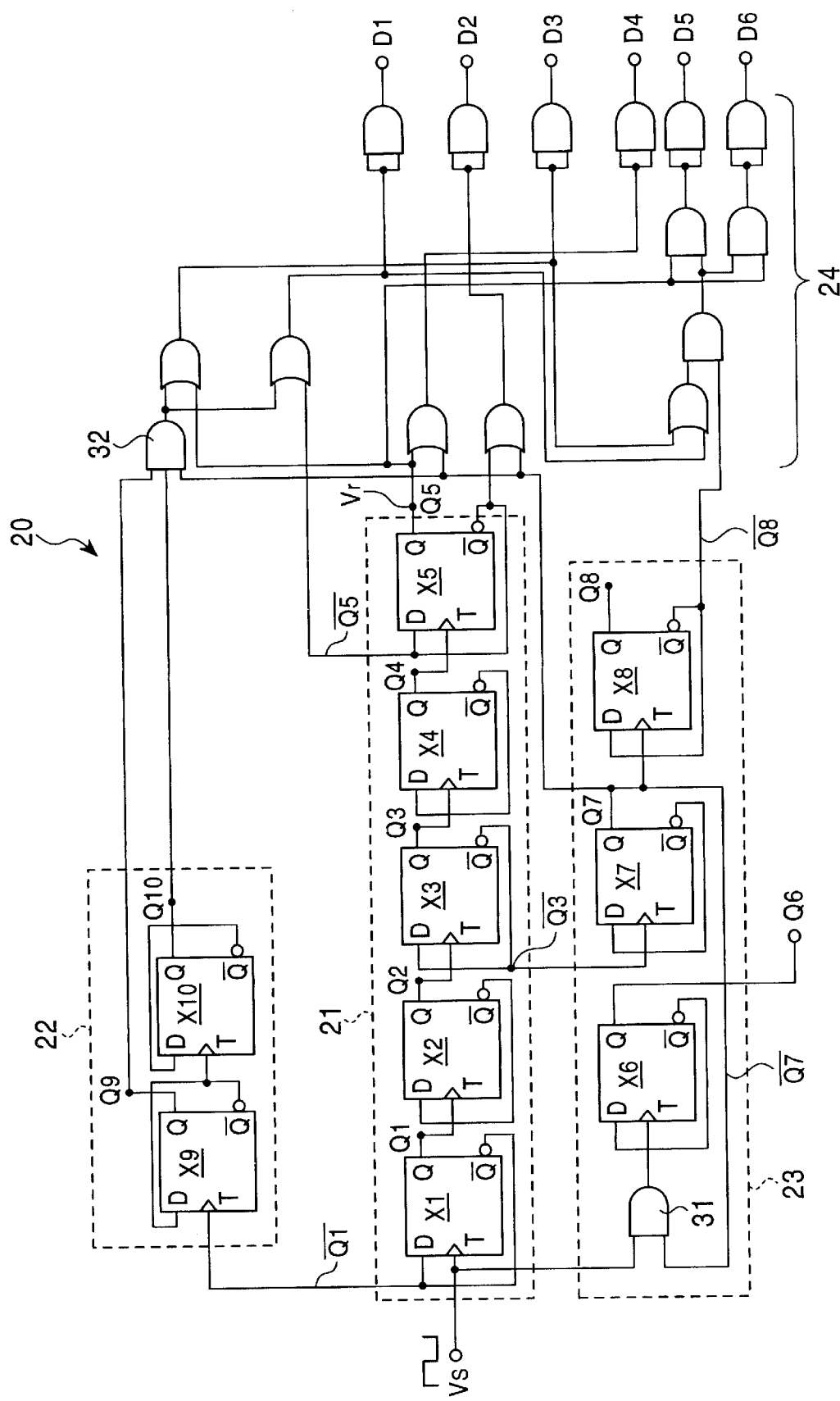
FIG. 2 is a circuit diagram in an embodiment of a control signal generating means.
Figure 3:
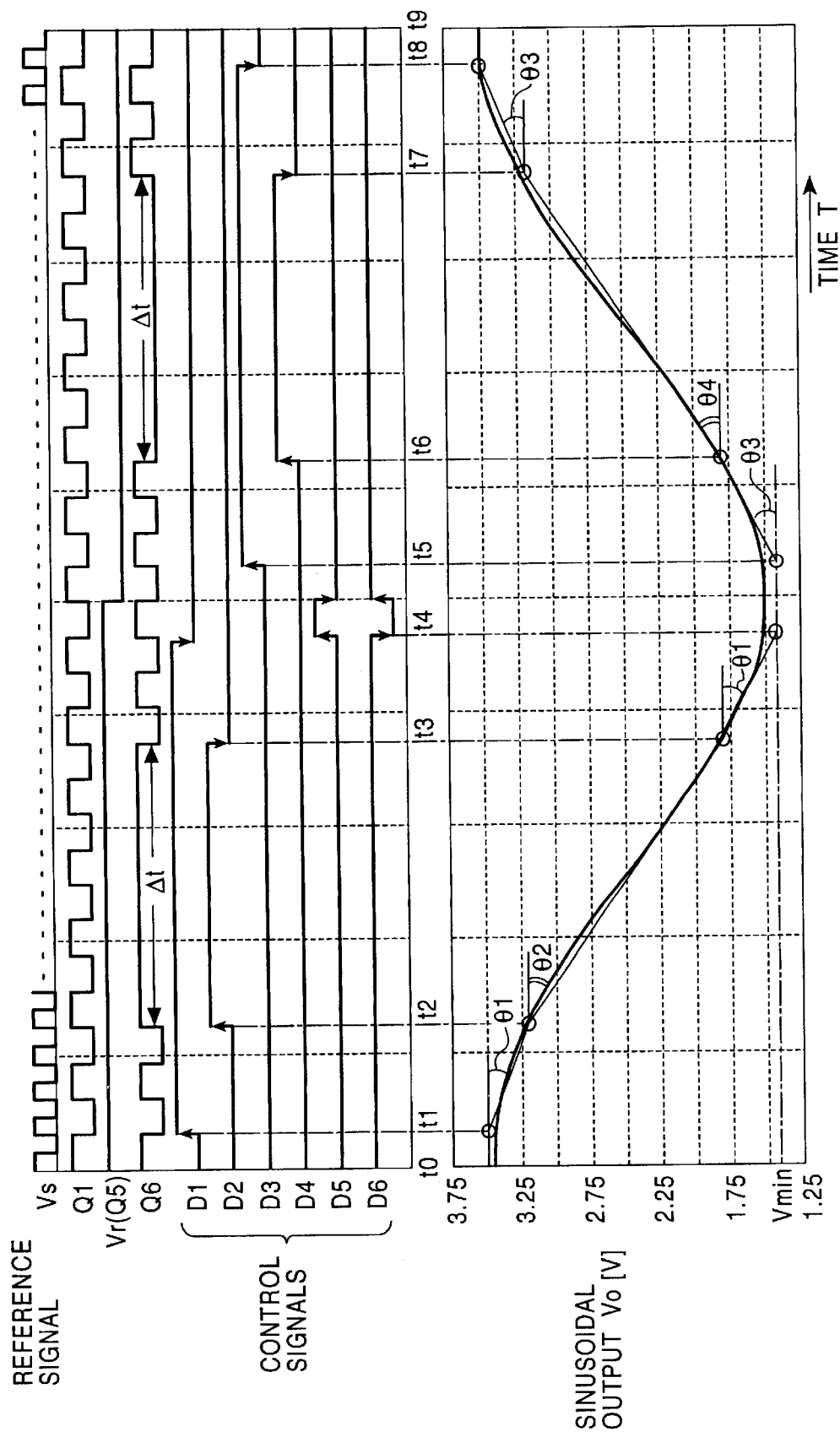
FIG. 3 is a diagram of a timing chart of respective signals and a sinusoidal output signal.

FIG. 2 shows a circuit arrangement for an embodiment of a control signal generating means, and FIG. 3 is a diagram of a timing chart for respective signals and a sinusoidal output signal.

The control signal generating means 20 is constituted, for instance, by a first divider 21, a second divider 22, a pause duration determining circuit 23 and a logic circuit 24 including a plurality of AND and/or OR gates. The first divider 21 is formed by a five stage-cascade connection of D type flip-flops (FF) X1, X2, X3, X4 and X5. A rectangular (digital) reference signal Vs is supplied as a reference signal for the sinusoidal output to the T terminal of the first stage flip-flop X1. The rectangular reference signal Vs supplied to the first divider 21 is output from the Q terminal (Q5) of the flip-flop X5 as a divided signal Vr obtained by dividing the input signal by $\frac{1}{2}^5 = \frac{1}{32}$ (see Vr (Q5) in FIG. 3).

The second divider 22 is constituted by the two-stage cascade connection of D type flip-flops (FF) X9 and X10.

The inverted output $\overline{Q1}$ of the first flip-flop X1 in the first divider 21 is connected to the T terminal of the first flip-flop X9. Accordingly, the outputs Q9 and Q10 of the second divider 22 are the output signals obtained by dividing the inverted output $\overline{Q1}$ by ½ and ¼, respectively.

The pause duration determining circuit 23 is constituted by an AND gate 31 and D type flip-flops X6, X7 and X8. The reference signal Vs is supplied to one input terminal of the AND gate 31, and the inverted output $\overline{Q7}$ of the flip-flop X7 is supplied to the other input terminal thereof. An AND output of the reference signal Vs and the inverted output $\overline{Q7}$ is supplied to the T terminal of the flip-flop X6, and then the output Q6 of the flip-flop X6 is provided as a signal containing a predetermined pause duration Δt (time interval t2–t3 and time interval t6–t7) for the output Q1 of the first flip-flop X1 in the first divider 21, as shown in FIG. 3.

The flip-flops X7 and X8 form a divider and the inverted output $\overline{Q3}$ of the third stage flip-flop X3 in the first divider 21 is supplied to the T terminal of the flip-flop X7. Accordingly, the outputs Q7 and QB correspond to the outputs obtained by dividing the inverted output $\overline{Q3}$ by ½ and ¼, respectively.

The logic circuit 24 generates control signals D1, D2, D3, D4, D5 and D6 exhibiting the timing shown in FIG. 3 with the aid of output signals Q5, $\overline{Q5}$, Q6, Q7, $\overline{Q8}$, Q9 and Q10 of the flip-flops X5, X6, X7, X8, X9 and X10 via a plurality of AND gates and OR gates or the like. The control signals D1, D2, D3, D4, D5 and D6 are supplied to the respective base terminals of the transistors Tr7, Tr8, Tr17, Tr18, Tr24 and Tr25.

In the following, the function of the sinusoidal signal generating circuit according to the invention and the process of generating the sinusoidal signal will be described.

In the event of discharging

Firstly, assuming that the charging voltage Vc of the capacitor C has already reached the maximum charging voltage Vmax [V] in the initial state (time t=t0), the following event is described.

When the rectangular reference signal Vs is provided, the control signal generating means 20 generates the respective control signals D1, D2, D3, D4, D5 and D6, as shown in FIG. 3. Among the control signals D1, D2, D3, D4, D5 and D6, the control signal D1 arrives at the H level in the earliest stage.

Then, assuming that the control signal D1 changes from the L level to the H level at time t1, the event is further described. When the control signal D1 is supplied to the base terminal of the transistor Tr7 in the discharging unit 1, a constant current I1 flows through the transistors Tr1, Tr3, Tr6, the resistor R4 and the transistor Tr7, because the transistor Tr7 is set to be in the ON state. In this case, the magnitude of the constant current I1 is determined substantially by the supply voltage Vcc and the resistor R4.

In the current mirror circuit 11, moreover, a constant current I2 flows through the transistors Tr2, Tr4 and Tr22, and the magnitude of the constant current I2 is the same as the above-mentioned constant current I1 (I2=I1). In the charging unit 2, however, the constant current I3 and the constant current I4 shown in the drawing do not flow, since both the transistors Tr17 and Tr18 are in the OFF state.

In this case, the constant current I2 flows in the current mirror circuit 13 and the transistor Tr21 becomes to be in the ON state, so that a base current flows into the base terminal of the transistor Tr23, and therefore the transistor Tr23 is set to be in the ON state. However, the constant current I4 has been suppressed, i.e., I4=0, as described above. Then, the charges accumulated in the capacitor C are discharged via the transistor Tr23, and therefore the discharge current $I_D$ flows from the capacitor C to the transistor Tr23. As a result, the potential (Vmax [V]) of the capacitor C gradually decreases after time t1, as shown by the sinusoidal output in FIG. 3.

Here, the slope θ1 of the sinusoidal output (the slope of the potential of the capacitor) is determined by the electrostatic capacity of the capacitor C and the discharge current $I_D$, where the discharge current $I_D$ is proportional to the base current $I_b$ flowing into the transistor Tr23. Moreover, the base current $I_b$ itself depends on the magnitude of the constant current I2. The magnitude of the constant current I2 is determined by the resistor R4 determining the magnitude of the constant current I1 on the basis of the function of the current mirror circuit 11, which serves to make the magnitude of the constant current I2 equal to that of the constant current I1. In other words, the slope θ1 can be determined by the time constant, which is given by the product of the resistance of the resistor R4 and the capacitance of the capacitor C in the discharging unit 1. The slope θ1 is maintained until the time t2 at which the subsequent control signal D2 changes. As a result, the sinusoidal output signal Vo has a slope θ1 during time interval t1–t2.

At time t2, the control signal D2 changes into the H level, after following the control signal D1, and the transistor Tr7 and the transistor Tr8 are set to be in the ON state. This leads to the state in which the resistor R4 is connected in parallel to the resistor R5 between the ground and the emitter terminal of the transistor Tr6. Accordingly, the magnitude of the constant current I1 is determined by the supply voltage Vcc and a parallel resistor R4·R5/(R4+R5) and so its value further increases. Since the base current $I_b$ flowing into the base terminal of the transistor Tr23 increases, the discharging current $I_D$ from the capacitor C can be increased. In other words, a slope θ2 after time t2 can be set to be greater than the slope θ1. The state of exhibiting the slope θ2 is maintained until time t3 at which the control signal D2 changes into the L level. Hence, the sinusoidal output signal Vo has the slope θ2 during time interval t2–t3.

At time t3, the control signal D2 changes into the L level, so that the transistor Tr5 is set to be in the OFF state. Hence, the same state is maintained during time interval t1–t2, and so the slope of the sinusoidal output signal Vo can be returned to θ1. This state is maintained until time t4. Accordingly, the potential of the capacitor C follows the slope θ1 during time interval t3–t4.

At time t4, the control signal D1 changes into the L level. Accordingly, the transistor Tr7 turns off, i.e., changes to the OFF state, so that the constant currents I1 and I2 are interrupted, and the transistors Tr21 and Tr23 turn off. As a result, the discharging current $I_D$ becomes to be in the state of breaking and so the capacitor C is set at a potential Vc. At time t4, moreover, a positive logic pulse signal is generated in the control signal D5 and a negative logic pulse signal is generated in the control signal D6, so that the transistors Tr24 and Tr25 in the clamping means 4 are simultaneously set to be in the ON state.

The lower limit supply voltage Vmin is supplied to the connection point 4a of the clamping means 4. When, therefore, the potential Vc of the capacitor C is greater than the lower limit supply voltage Vmin (Vc>Vmin), a discharging current $I_{D1}$, flows from the capacitor C via both the resistor R8 and the transistor Tr24 to the lower limit supply voltage Vmin, thereby the potential of the capacitor C becomes the same voltage as the lower limit supply voltage Vmin. On the contrary, when the potential Vc of the capacitor C is smaller than the lower limit supply voltage Vmin (Vc<Vmin), a charging current $I_{C1}$ flows from the lower limit supply voltage Vmin via both the transistor Tr25 and the resistor R8 to the capacitor C, thereby the potential at the capacitor C becomes the same voltage as the lower limit supply voltage Vmin. In summary, when the extreme value (potential Vc) of the sinusoidal output Vo in the negative direction is either in a state of a potential greater or smaller than the lower limit supply voltage Vmin, it is possible to always set the extreme value of the sinusoidal output Vo in the negative direction to the lower limit supply voltage Vmin. As a result, the sinusoidal output Vo can be specified by the amplitude relative to the standard of the lower limit supply voltage Vmin, thereby making it possible to always set the sinusoidal output Vo within a given dynamic range. In conjunction with the above, the time constant of the discharging current $I_{D1}$ or the charging current $I_{C1}$ is given by the product C·R8 of the resistor R8 and the capacity of the capacitor C, thereby making it possible to set the potential of the capacitor C to the lower limit supply voltage Vmin without delay so long as the resistor R8 has an appropriate value.

In the event of charging

At time t5, the control signal generating means 20 serves to change only the control signal D3 into the H level, so that only the transistor Tr17 is set in the ON state, whereas the transistors Tr7, Tr8, Tr18, Tr24 and Tr25 are maintained to be in the OPP state. As a result, a constant current I3 flows through transistors Tr11, Tr13, Tr16, the resistor R6 and the transistor Tr17 in the charging unit 2, where the magnitude of the constant current I3 is determined by the supply voltage Vcc and the resistor R6. Moreover, a constant current I4 having the same magnitude as that of the constant current I3 flows through the transistors Tr12 and Tr14 which form the current mirror circuit 12 in the charging unit 2. On the other hand, neither the constant current I1 nor I2 flows in the discharging unit 1, so that all the transistors Tr21, Tr22 and Tr23 in the current mirror circuit 13 are set to be in the OFF state. In this case, the transistors Tr24 and Tr25 in the clamping means 4 are also set to be in the OFF state. As a result, the constant current I4 flows as a charging current $I_C$ into the capacity C, thereby starting to charge the capacitor C. As shown by the sinusoidal output Vo in FIG. 3, the potential of the capacitor C gradually increases after time t5.

The time constant in this case is determined by the product C·R6 of the capacitor C and the resistor R6, and therefore the slope θ3 of the sinusoidal output Vo after time t5 is controlled by the time constant C·R6. Such a state is maintained until time t6 at which the control signal D4 changes.

At time t6, the control signal D4 changes into the H level, so that after following the transistor Tr17, the transistor Tr18 is set to be in the ON state. As a result, the emitter terminal of the transistor Tr16 in the charging unit 2 is connected to the ground via a parallel circuit of resistors R6 and R7, so that the constant current I3 is determined by the supply voltage Vcc and the parallel resistance (R6·R7/(R6+R7)), thus being so increased. Hence, the constant current I4 flowing in the current mirror circuit 12 increases and the charging current $I_C$ for the capacitor C also increases, so that the slope of the sinusoidal output Vo is set to θ4 after time t5. The time constant in this case can be determined, similarly in the above-mentioned case, by the product C·(R6·R7/(R6+R7)) given by the capacitor C and the parallel resistance (R6·R7/(R6+R7)). Therefore, the slope θ4 of the sinusoidal output Vo after time t6 becomes greater than the slope θ3 during the time interval t5=t6 (θ4>θ3). The sinusoidal output Vo is generated in accordance with the above-mentioned slope θ4 until time t7 at which the control signal D4 changes to the L level, and the potential of the capacitor C increases in accordance with the slope θ4 in the time interval t6–t7.

At time t7, only the control signal D4 changes into the L level, and the control signal D3 is maintained in the H level. Consequently, the transistor Tr17 is set to be in the ON state and the transistor Tr18 is set to be in the OFF state. This state is identical with that in the time interval t5–t6, so that the slope of the sinusoidal output becomes θ3. The sinusoidal output Vo is generated with the slope θ3 until the subsequent time t8, and therefore the potential of the capacitor C increases in accordance with the slope θ3 in the time interval t7–t8.

At time t8, the control signal D3 changes into the L level, so that the transistors Tr17 and Tr18 are set to be in the OFF state, and the constant current I3 is interrupted. As a result, the charging current $I_D$ (constant current I4) flowing into the capacitor C is interrupted, so that the potential Vc of the capacitor C is set to be Vmax [V], which is the maximum of the sinusoidal output Vo. Finally, at time t9, the generation of the sinusoidal output Vo over one cycle is completed.

In the above description, by setting the resistor R4 and resistor R6 in such a manner that they have the same value (R4=R6), it is possible to coincide the slope θ1 in the case of discharging (time interval t1–t2 and time interval t3–t4) with the slope θ3 in the case of charging (time interval t5–t6 and time interval t7–t8) (θ1=θ3). Moreover, by setting the resistor R5 and resistor R7 in such a manner that they have the same value (R5=R7), it is possible to coincide the slope θ2 in the case of discharging (time interval t2–3) with the slope θ4 in the case of charging (time interval t6–t7) (θ2=θ4). Hence, a well-balanced sinusoidal output Vo can be obtained.

In the above description, the case, in which the connection point 4a is connected to the lower limit supply voltage Vmin, is described. However, the present invention is not restricted to the above case. For instance, it is possible to connect the connection point 4a to the upper limit supply voltage Vmax which corresponds to the upper limit voltage of the sinusoidal output Vo. In this case, however, it is preferable that the time at which the control signals D5 and D6 output a pulse signal is not time t4, but time t8, i.e., the time at which the sinusoidal output Vo reaches a positive extreme. From this fact, it is possible to set the positive extreme of the sinusoidal output Vo at the upper limit supply voltage Vmax. As a result, the sinusoidal output Vo can be specified as an amplitude relative to the standard of the upper limit supply voltage Vmax, thereby making it possible to always set the sinusoidal output Vo within a given dynamic range in a case similar to that in which the standard is set as the lower limit supply voltage Vmin.

In the above sinusoidal signal generating circuit, the sinusoidal output Vo can be produced by respective control signals D1, D2, D3, D4, D5 and D6, which can be accurately specified by the reference signal Vs in the time axis. consequently, no phase delay can appear in the sinusoidal output Vo, even if, for instance, the resistance @f the resistor and the capacitance of the capacitor C change due to a possible temperature variation.

As shown in FIG. 3, furthermore, the sinusoidal signal generating circuit performs the action in which a sinusoidal signal is produced by the linear approximation of the amplitude of the sinusoidal output Vo in the vicinity of the central points, i.e., in the vicinity of the time when the sinusoidal output Vo changes from a positive value to a negative value (time interval t2–t3) and in the vicinity of the time when the sinusoidal output Vo changes from a negative value to a positive value (time interval t6–t7), in other words, in the pause duration Δt, and that the control signals D1–D6 do not change within the pause duration Δt. It follows from this fact that the switching operation of these transistors can be suppressed at least during the pause duration Δt, thereby enabling undesirable noise, in particular, noise containing high frequency signal components to be suppressed. As a result, no undesirable effect due to the noise can arrive at the other circuit components.

The sinusoidal output Vo thus generated is supplied to the external part via the buffering means 5. The sinusoidal output Vo is amplified by an appropriate amplifying means, if necessary, and the output is used, for instance, as a driving signal for activating a vibrating element in an angular velocity sensor.

Figure 4:
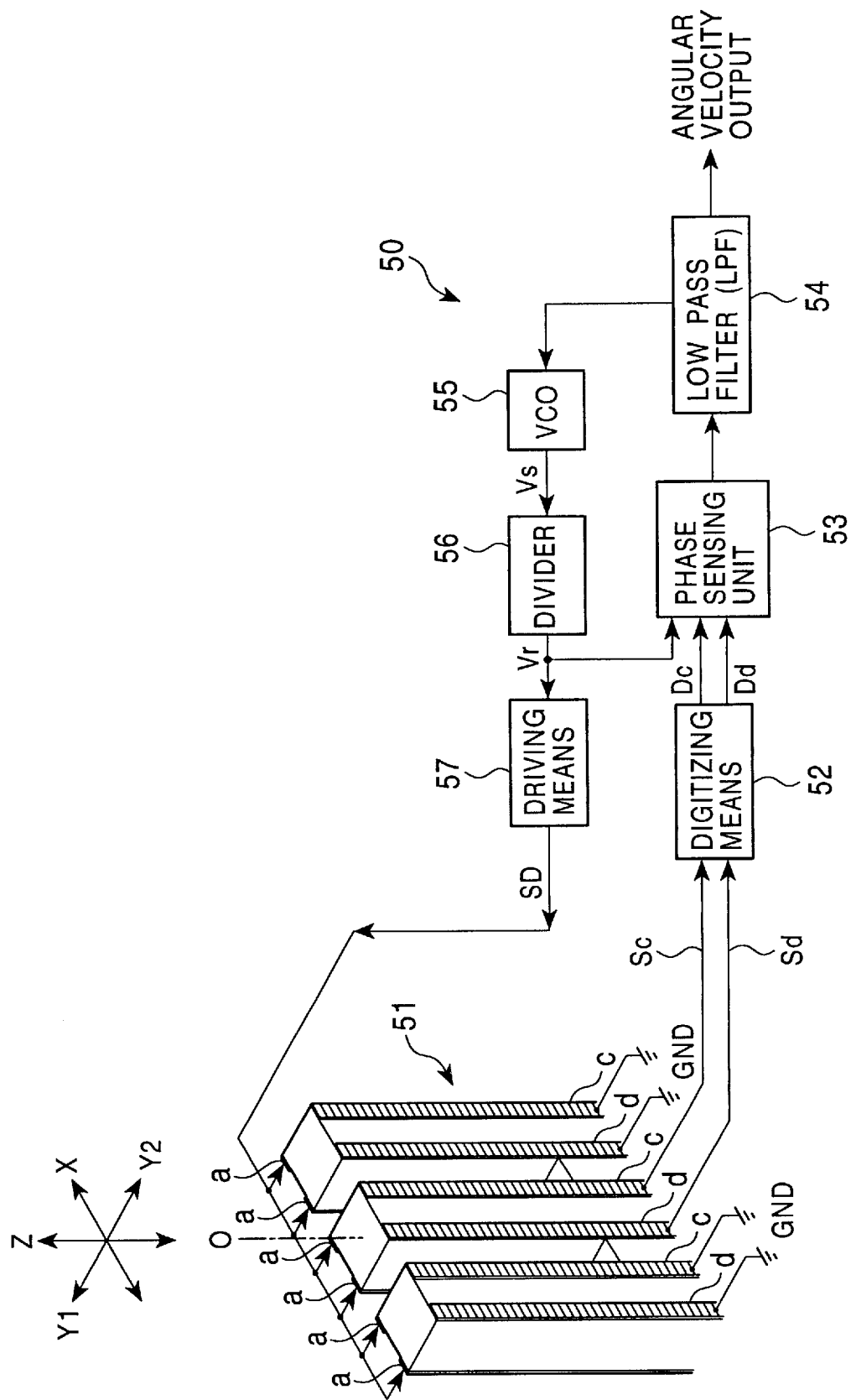
FIG. 4 is a block diagram showing an apparatus for driving a vibrating element in an angular sensor wherein a sinusoidal signal generating circuit as an embodiment is used.
Figure 5A:
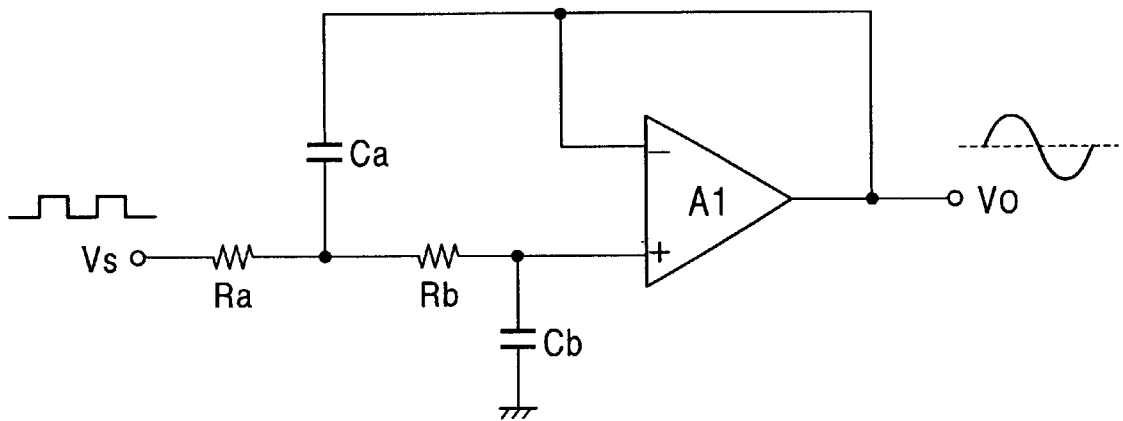
FIG. 5 is a circuit diagram showing a sinusoidal signal generating circuit in the prior art.
Figure 5B:
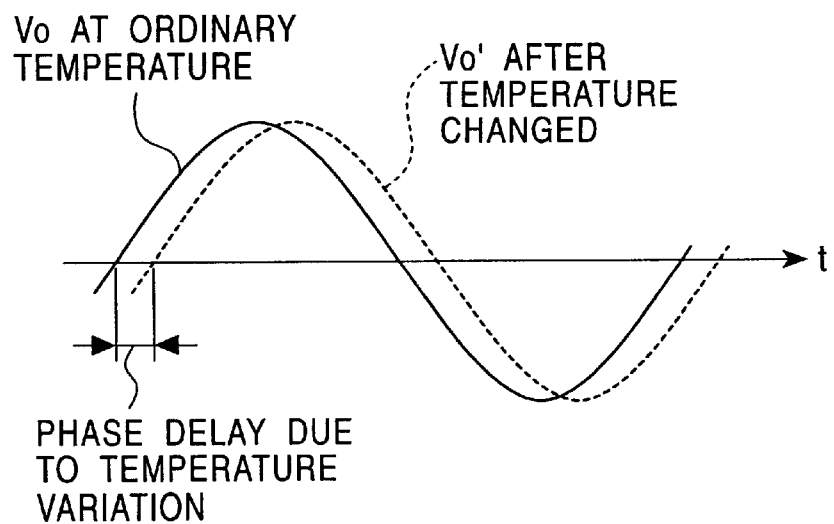
Figure 6:
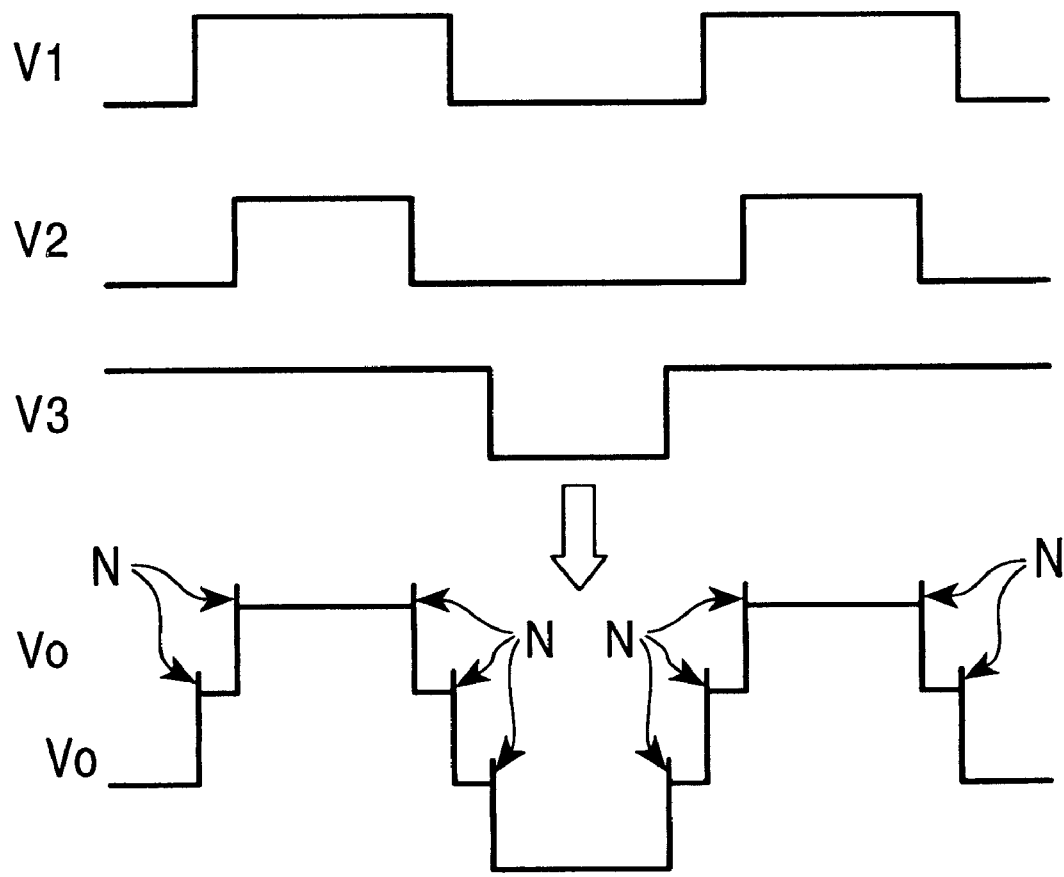
FIG. 6 shows diagrams for explaining the concept in another sinusoidal signal generating circuit and the method for generating such a sinusoidal signal.

FIG. 4 shows a block diagram of an apparatus for driving a vibrating element for an angular velocity sensor in which the sinusoidal signal generating circuit as an embodiment is used.

The angular velocity sensor shown in FIG. 4 consists of a vibrating element 51 as a sensing means (sensor), a drive control unit 50 for activating the vibrating element 51 by a driving signal SD having a predetermined driving frequency, and a detection control unit for detecting the angular velocity signals supplied from the vibrating element 51.

The vibrating element 51 is, for example, a piezoelectric type vibrator as a transducer or an electrostatic capacitor type vibrator as a transducer, and it has a plurality of vibrating legs (e.g., three legs) branched from the front end of the vibrating element 51, which extends in the axial direction. An input electrode a extending in the axial direction (the Z direction) is formed on one surface (on the Y1 side) of each vibrating leg, whereas a pair of output electrodes c and d is formed on the other surface (on the Y2 side). In the vibrating element 51, the driving signal SD is supplied via a driving means 57 to the input electrode a of each vibrating leg, and thus each vibrating leg is driven to vibrate in the direction (in the X direction) in which the vibrating legs are aligned to face each other. When the vibrating element 51 is disposed around an axis of the extended shaft O as a center, the vibrating element 51 is bent in the direction of vibration (in the X direction) and in the direction perpendicular thereto (in the Y direction) by the Coriolis force resulting from rotation. Due to the bending deformation, output signals Sc and Sd, whose phases are different from each other, are supplied in accordance with the magnitude of the Coriolis force from a pair of output electrodes c and d which are mounted on the other surface of the vibrating element.

In the above-mentioned drive control unit 50, the vibrating element 51 is activated by a PLL (phase locked loop) and a driving means 57, where the PLL consists of a digitizing means 52, a phase detection unit 53, a low pass filter (LPF) 54, a VCO (voltage controlled oscillator) 55 and a divider 56. When a driving signal SD having a sinusoidal waveform is supplied from the driving means 57 to the vibrating element 51, output signals Sc and Sd having a sinusoidal waveform are also supplied from the detection electrodes c and d of the vibrating element 51. When the vibrating element 51 is disposed in a rotary system, a phase difference, which corresponds to the Coriolis force resulting from the rotation, arises between the output signals Sc and Sd.

In the digitizing means 52, the output signals (sinusoidal outputs) Sc and Sd of the vibrating element 51 are converted into corresponding binary signals Dc and Dd relative to the standard of a predetermined threshold voltage. In the drive control unit 50, the above-mentioned pause duration Δt is determined as a duration between the timings before and after the output signals Sc and Sd cross the threshold voltage. As a result, it is possible to avoid the inclusion of a noise containing undesirable high frequency signal components into the sinusoidal output Vo as well as the binary signals Dc and Dd, which are generated in the drive control unit 50.

In the phase difference detection unit 53, the binary signals Dc and Dd are compared, regarding the phase, with the divided signal Vr which is determined in the divider 56 by dividing the reference signal Vs supplied from VCO 55, and the phase difference thus obtained is output as a differential signal. A smoothing treatment is applied to such a pulse-like differential signal in the LPF 54 (possessing the function of integration and suppression of the high frequency signal components), and supplied to the control terminal (not shown) of the VCO 55 as a VCO control signal. The VCO 55 has a free running frequency. When a VCO control signal is supplied to the VCO 55, this oscillator 55 adjusts the oscillating frequency, based on the VCO control signal, and supplies the above-mentioned reference signal Vs which is used to lock the oscillation frequency to the midpoint of the time width corresponding to the phase difference between the binary signals Dc and Dd. As a result, the driving signal SD, i.e., the signal input to the vibrating element 51, is controlled so as to always be locked to the sinusoidal output (the midpoint of the time width corresponding to the phase difference between output signals Sc and Sd) of the vibrating element 51.

The divider 56 herein has an ability to divide the oscillating frequency of the VCO 55 down to the driving frequency for activating the vibrating element 51, and can be constituted by the first divider 21 shown in FIG. 2. Moreover, the sinusoidal signal generating circuit shown in FIG. 1 can be used for the driving means 57, and serves to generate the sinusoidal output Vo from the reference signal Vs supplied from the VCO 55. In the driving means 57, furthermore, a driving signal SD is generated by amplifying the sinusoidal output Vo.

In this angular velocity sensor, therefore, the divider 56 can be used not only as an element of the PLL, but also as an element of the driving means 57 for supplying the sinusoidal output Vo to the vibrating element 51.

By utilizing such a sinusoidal signal generating circuit, a highly accurate driving signal can be generated, and ensures to detect the time width corresponding to the phase difference between the output signals Sc and Sd. By smoothing the time corresponding to the phase difference with integration, a highly accurate angular velocity can be determined.

In the above description, an embodiment of generating the sinusoidal signals is explained. However, it is also possible to generate other waveforms (for instance, a triangular waveform, trapezoidal waveform or the like) by approximately combining the control signals in the control signal generating means.

Moreover, the control signal generating means can be realized by computer control, in which case, it is possible to freely generate the control signals with the aid of software.

In accordance with the present invention, it is possible to generate a highly accurate sinusoidal signal without any phase delay.

Since, moreover, it is possible to provide pause duration before and after the switching timing of the sinusoidal signal, the inclusion of the noise containing high frequency signal components in the sinusoidal output can be rejected.

Moreover, by utilizing the above-mentioned sinusoidal signal generating circuit in an angular velocity sensor, it is possible to activate a vibrating element in a highly accurate manner, thereby making it possible to accurately determine the angular velocity.

What is claimed is:

1. A sinusoidal signal generating circuit comprising a capacitor for charging and discharging, a charging unit for supplying a predetermined charging current to the capacitor, and a discharging unit for discharging a discharging current from the capacitor, whereby an output signal is produced by the change in the potential of the capacitor, said circuit being characterized in that:

said charging unit comprises a charging current adjusting unit for adjusting the magnitude of the charging current, and said discharging unit comprises a discharging current adjusting unit for adjusting the magnitude of the discharging current, and a control signal generating means is provided for supplying a plurality of control signals to both said charging current adjusting unit and said discharging current adjusting unit in such a manner that the potential of the capacitor changes into a sinusoidal waveform.

2. A sinusoidal signal generating circuit according to claim 1, wherein said control signal generating means is formed of at least one divider for dividing a reference signal, a pause duration determining circuit for suppressing the output signal from said dividers for a predetermined duration so as not to change said control signals and a logic circuit for generating said control signals in a predetermined timing from signals supplied from said dividers and said pause duration determining circuit.

3. A sinusoidal signal generating circuit according to claim 1, wherein said charging current adjusting unit and said discharging current adjusting unit each comprise a plurality of resistors for adjusting the magnitude of a current flowing in a constant current circuit and a switching means for switching the connections of these resistors, and wherein said switching means is controlled by said control signal generating means.

4. A sinusoidal signal generating circuit according to claim 1, wherein a slope of the potential in the capacitor is determined by a time constant, which is specified by a product of the resistance of said resistor and said capacitance.

5. A sinusoidal signal generating circuit according to claim 1, wherein said charging unit and said discharging unit each comprise a current mirror circuit.

6. A sinusoidal signal generating circuit according to claim 1, wherein a clamping circuit is provided for clamping at least one positive or negative extreme of the sinusoidal output to a predetermined value voltage.

7. A sinusoidal signal generating circuit according to claim 1, wherein a temperature correcting means is provided for adjusting the magnitudes of both said charging current and said discharging current in accordance with a temperature variation.

8. An apparatus for driving a vibrating element, said apparatus comprising the vibrating element for supplying two output signals for a given angular velocity, the phases of said output signals being different from each other, a digitizing means for converting said two output signals into binary signals in accordance with the polarity of the amplitude of said output signals, a phase difference sensing means for supplying a pulse signal corresponding to a differential signal by determining the phase difference between said two binary signals, a low pass filter for generating a control signal from said pulse signal, a voltage controlled oscillator for providing an oscillation at a frequency in accordance with said control signal, a dividing means for generating a divided signal having a predetermined frequency by dividing a reference signal supplied from said voltage controlled oscillator, and a driving means for generating a driving signal for said vibrating element from said divided signal, said apparatus being characterized in that:

the sinusoidal signal generating circuit according to claim 1 is used as said dividing means and said driving means.

9. An apparatus for driving a vibrating element, according to claim 8, wherein, in said sinusoidal signal generating circuit, said control signal generating means is formed of at least one divider for dividing a reference signal, a pause duration determining circuit for suppressing the output signal from said dividers for a predetermined duration so as not to change said control signals and a logic circuit for generating said control signals with a predetermined timing from signals supplied from said dividers and said pause duration determining circuit.

10. An apparatus for driving a vibrating element, according to claim 8, wherein in said sinusoidal signal generating circuit, said charging current adjusting unit and said discharging current adjusting unit each comprise a plurality of resistors for adjusting the magnitude of a current flowing in a constant current circuit and a switching means for switching the connections of these resistors, and wherein said switching means is controlled by said control signal generating means.

11. An apparatus for driving a vibrating element, according to claim 8, wherein in said sinusoidal signal generating circuit, the slope of the potential in the capacitor is determined by a time constant, which is specified by a product of the resistance of said resistance and the capacitance of said capacitor.

12. An apparatus for driving a vibrating element, according to claim 8, wherein in said sinusoidal signal generating circuit, said charging unit and said discharging unit each comprise a current mirror circuit.

13. An apparatus for driving a vibrating element, according to claim 8, wherein in said sinusoidal signal generating circuit, a clamp circuit is provided for clamping at least one positive or negative extreme of the sinusoidal output to a predetermined value voltage.

14. An apparatus for driving a vibrating element, according to claim 8, wherein in said sinusoidal signal generating circuit, a temperature correcting means is provided for adjusting the magnitudes of both said charging current and said discharging current in accordance with a temperature variation.

* * * * *

UNITED STATES PATENT AND TRADEMARK OFFICE
CERTIFICATE OF CORRECTION

PATENT NO. : 6,483,356 B2 Page 1 of 1
DATED : November 19, 2002
INVENTOR(S) : Suzuki et al.

It is certified that error appears in the above-identified patent and that said Letters Patent is hereby corrected as shown below:

Column 4,
Line 38, change "RS" to -- R5 --

Column 8,
Line 27, change "OPP" to -- OFF --
Line 46, change "83" to -- 03 --

Signed and Sealed this

Eighth Day of April, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,483,356 B2
DATED : November 19, 2002
INVENTOR(S) : Suzuki et al.

It is certified that error appears in the above-identified patent and that said Letters Patent is hereby corrected as shown below:

<u>Title page,</u>
Item [73], add Assignee, -- Sanyo Electric Co., Ltd. --

Signed and Sealed this

Fifth Day of August, 2003

JAMES E. ROGAN
*Director of the United States Patent and Trademark Office*